United States Patent [19]

Marshall

[11] Patent Number: 4,647,860

[45] Date of Patent: Mar. 3, 1987

[54] APPARATUS FOR AUTOMATING STANDARD VOLTAGE REFERENCE CELL INTERCOMPARISONS

[76] Inventor: James A. Marshall, 1950 Polk Ct., Mtn. View, Calif. 94040

[21] Appl. No.: 610,423

[22] Filed: May 15, 1984

[51] Int. Cl.$^4$ ............................................. G01N 27/46
[52] U.S. Cl. ...................................... 324/433; 324/434
[58] Field of Search ............... 324/426, 431, 433, 434; 340/636; 361/191; 307/43, 48, 115

[56] References Cited

PUBLICATIONS

Harayama et al., Automatic Measuring System for a Control of Standard Cells, IEEE Transactions on Instrumentation and Measurement, vol. IM-21, No. 4, Nov. 1972.

Arri et al., Development of a Standard Cell Reference Group With Microprocessor-Controlled Intercomparisons, IEEE Transactions on Instrumentation and Measurement, vol. IM-28, No. 4, Dec. 1979.

*Primary Examiner*—Stewart J. Levy
*Assistant Examiner*—Kevin D. O'Shea
*Attorney, Agent, or Firm*—Douglas L. Weller

[57] ABSTRACT

An apparatus is presented for performing standard cell intercomparisons. An operator selects two cells in order to compare their relative voltage values. A first terminal on each cell is coupled through a common line switch associated with that cell to a common line. A second terminal on each cell is similarly coupled through an associated A switch to an A line and through an associated B switch to a B line. A potentiometer can be used to compare the voltage on line A with the voltage on line B to determine the relative voltage difference between the cells. Various mechanisms within the apparatus insure protection of the cells. These mechanisms include: encoding of selection information to insure only one cell for the A line and only one cell for the B line is selected; limiting the power available to switches so only one switch can be turned on within a given time span; inclusion of a protection line associated with the A line, and a protection line associated with the B line so that a logic control circuit can detect when a cell is coupled to the A line or the B line and prevent a second cell from being coupled to either the A line or the B line; and, requiring an operator to simultaneously depress two pushbuttons located on a front panel of the apparatus in order to select a cell to be coupled to either the A line or the B line.

12 Claims, 6 Drawing Figures

APPARATUS FOR AUTOMATING STANDARD VOLTAGE REFERENCE CELL INTERCOMPARISONS

BACKGROUND

Standard voltage reference cells (herein cells) regardless of the care used in production vary in voltage output when measured in the microvolt and nanovolt range. For applications requiring voltage accuracy and for use in standards labs groups of cells are intercompared to detect variances in voltage between the cells.

Under the Group Voltage Measurement Assurance Program sponsored by the National Bureau of Standards (NBS), individual cells in groups of four or six cells are intercompared with individual cells in other groups. By intercomparison is meant determining the voltage potential difference between two cells. NBS has recommended a method of intercomparing cells (see Eicke, Woodward G. and Auxier, Laurel M., *Regional Maintenance of the Volt Using NBS Volt Transfer Techniques*, IEEE TRANSACTIONS, Vol IM-23, No. 4, December 1974, pp. 290–294) by measuring the voltage difference between pairs of cells in a statistically balanced design. For instance, one possible design for comparing two groups of four cells is shown in Table I below:

TABLE I

| NO. | A SIDE | B SIDE |
|---|---|---|
| 1 | Group 1, Cell 1 (vs) | Group 2, Cell, 1 |
| 2 | Group 1, Cell 1 (vs) | Group 2, Cell, 3 |
| 3 | Group 1, Cell 3 (vs) | Group 2, Cell, 3 |
| 4 | Group 1, Cell 3 (vs) | Group 2, Cell, 1 |
| 5 | Group 1, Cell 2 (vs) | Group 2, Cell, 2 |
| 6 | Group 1, Cell 2 (vs) | Group 2, Cell, 4 |
| 7 | Group 1, Cell 4 (vs) | Group 2, Cell, 4 |
| 8 | Group 1, Cell 4 (vs) | Group 2, Cell, 2 |
| 9 | Group 2, Cell 2 (vs) | Group 1, Cell, 1 |
| 10 | Group 2, Cell 2 (vs) | Group 1, Cell, 3 |
| 11 | Group 2, Cell 4 (vs) | Group 1, Cell, 3 |
| 12 | Group 2, Cell 4 (vs) | Group 1, Cell, 1 |
| 13 | Group 2, Cell 1 (vs) | Group 1, Cell, 2 |
| 14 | Group 2, Cell 1 (vs) | Group 1, Cell, 4 |
| 15 | Group 2, Cell 3 (vs) | Group 1, Cell, 4 |
| 16 | Group 2, Cell 3 (vs) | Group 1, Cell, 2 |

As can be seen from Table I the eight cells (two groups of four) are compared using 16 measurements of voltage differences. Note also that each cell appears on the A side twice and on the B side twice.

When all cell comparisons are complete, a least squares fit of the values of the voltage difference between the cells can be computed. The values from the least squares fit can then be compared to the values measured and a standard deviation can be calculated.

Traditionally, voltage measurements between cells has been done by operators manually connecting cells together and detecting values. However, the amount of comparisons (e.g. 32 comparisons for comparing four groups of four cells), results in a great amount of time being spent by operators in performance of the cell measurements. Additionally, operator technique can affect the measured value resulting in different values being detected by different operators. Furthermore, there is a heightened danger of cell damage when measurement leads on cells are moved manually by operators. Commercially available cell scanners have proved to be either too expensive or not able to measure voltage values to sufficient levels of precision.

SUMMARY OF THE INVENTION

In accordance with the preferred embodiment of the present invention, an apparatus is presented for performing standard cell intercomparisons. A first terminal on each cell is coupled through a common line switch associated with that cell to a common line. A second terminal (opposite in polarity to the first terminal) on each cell is similarly coupled through an associated A switch to an A line and through an associated B switch to a B line. All switches are normally in the off (nonconducting) position.

When two cells are intercompared, the cells common line switches are both turned on, thus electrically coupling together the first terminals of the two cells. Additionally, the A switch on a first of the two cells is turned on coupling the second terminal of that cell to the A line. The B switch on the second of the two cells is then turned on coupling the second terminal of that cell to the B line. A potentiometer coupled to the A line and the B line detects the voltage difference between the A line and the B line to determine the voltage difference between the two cells.

Determining which two cells are to be intercompared may be done either manually by switches on the apparatus, or through interaction with a computing system.

Various mechanisms within the apparatus insure protection of the cells. These mechanisms include: encoding of selection information to insure only one cell for the A line and only one cell for the B line is selected; limiting the power available to switches so only one switch can be turned on within a given time span; inclusion of a protection line associated with the A line, and a protection line associated with the B line so that a logic control circuit can detect when a cell is coupled to the A line or the B line and prevent a second cell from being coupled to either the A line or the B line; and, requiring an operator to simultaneously depress two pushbuttons located on a front panel of the apparatus in order to select a cell to be coupled to either the A line or the B line.

DESCRIPTION OF THE PREFERRED EMBODIMENT

Figure 1:
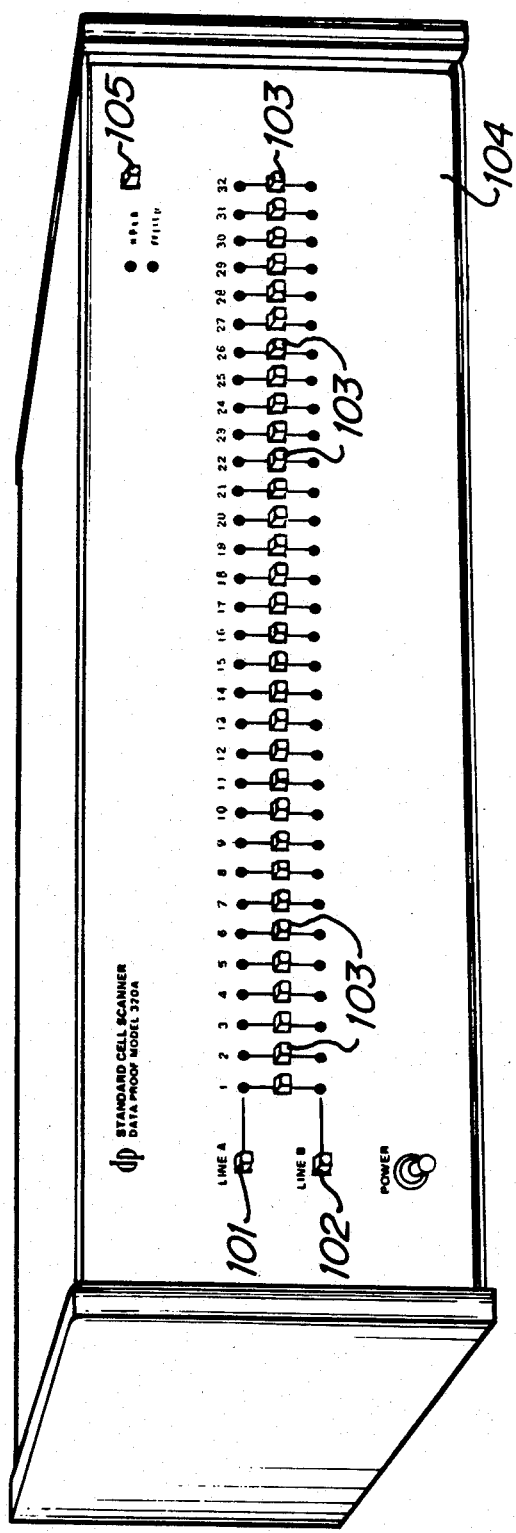
FIG. 1 shows a front panel of a standard cell intercomparator in accordance with the preferred embodiment of the present invention.

In FIG. 1, a front panel 104 of a standard cell intercomparator is shown. An opererator depresses a Line A pushbutton 101 or a line B pushbutton 102 simultaneously with a cell selection pushbutton from a series of cell selection pushbuttons 103 in order to select a standard cell. A pushbutton switch 105 when depressed restores control to pushbuttons 101, 102, 103 when cell selection was priorly done remotely by a computing system.

Figure 2:
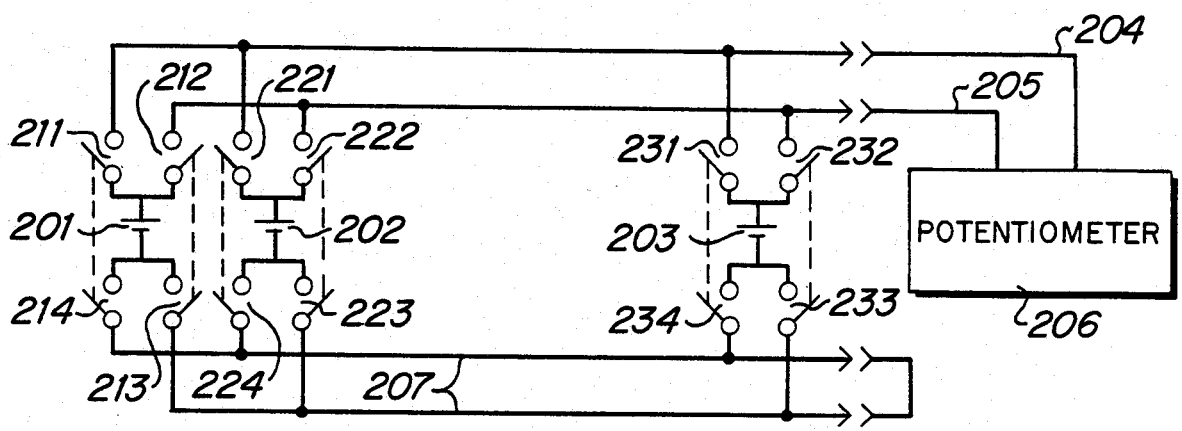
FIG. 2 shows a plurality of cells coupled through switches to a potentiometer.

In FIG. 2, a cell 201, a cell 202 and a cell 203 are shown. Cell 201 is coupled to an A line 204 through a switch 211, and to a B line 205 through a switch 212. Similarly, cell 202 is coupled to A line 204 through a switch 221, and to B line 205 through a switch 222; and cell 203 is coupled to A line 204 through a switch 231, and to B line 205 throught a switch 232. Cell 201 is coupled to a common line 207 through a switch 214 and a switch 213; cell 202 is coupled to common line 207 through a switch 224 and a switch 223; and cell 203 is coupled to common line 207 through a switch 234 and a switch 233. Although FIG. 2 shows only cells 201-203, typically there are many more cells, e.g. 32, similarly coupled to A line 204, B line 205, and C line 207.

Unless an operator selects a certain cell to be coupled to A line 204 or B line 205, all switches are in the off, i.e., open position. In order to perform an intercomparison between cell 201 (on A line 204) and cell 202 (on B line 205), an operator would simultaneously depress pushbutton 101 and a pushbutton from the series of pushbuttons 103 that corresponds to cell 201. After releasing these pushbuttons, the operator would then simultaneously depress pushbutton 102 and a pushbutton from the series of pushbuttons 103 that corresponds to cell 202. A potentiometer 206 would then measure the voltage difference between A line 204 and B line 205 to complete the intercomparison.

In FIG. 2, switches 211-214, 221-224, and 231-234 are shown as being single-pole-single-throw switches. In the preferred embodiment—to protect against thermoelectric potentials—latching relays may be used, for instance a latching relay, part No. 12BW3LD manufactured by The PRINTACT Division of Executone Corporation having a place of business in Long Island City, N.Y. 11101. Additional design constraints to limit thermoelectric potentials include enclosure of switches 211-214, 221-224, and 231-234 in an isothermal container and the use of gold contacts throughout the apparatus. These design constraints reduce variations in thermoelectric voltage potentials to a level below a measurable range of variation in voltage potential across cells 201, 202, and 203.

Figures 3A, 3B:
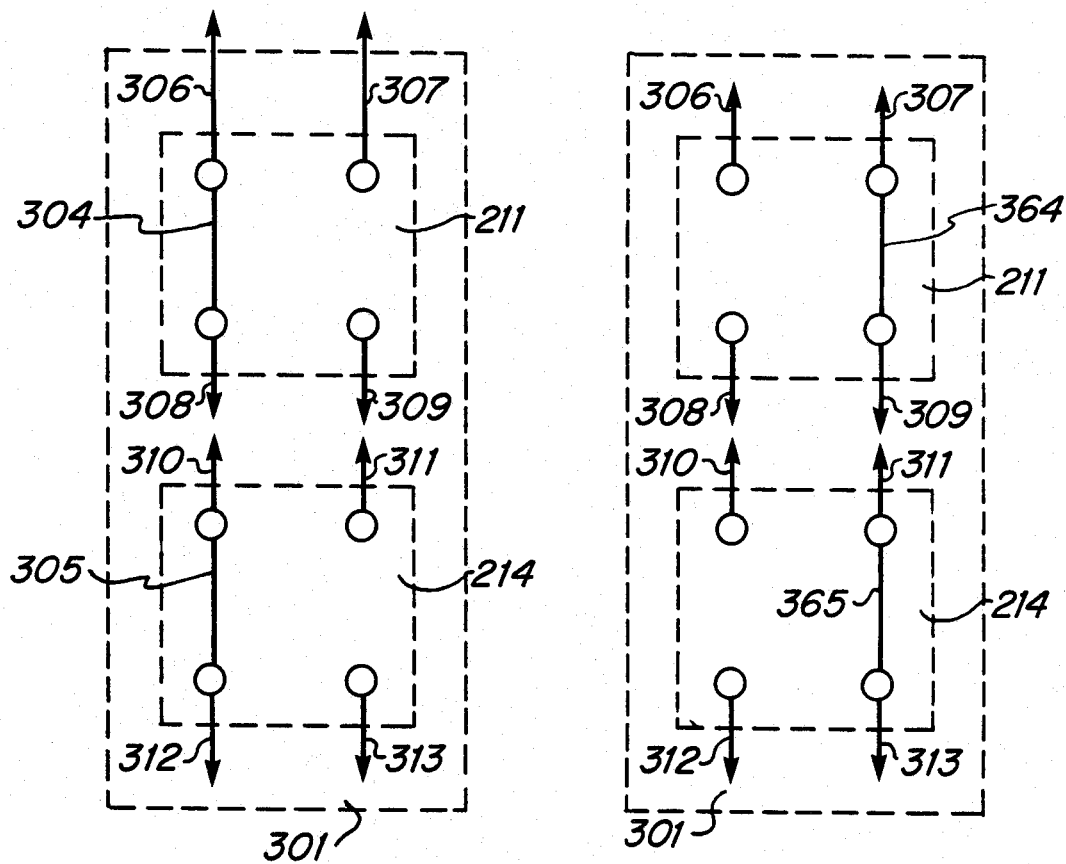
FIGS. 3A and 3B show schematics of a relay switch in accordance with the preferred embodiment of the present invention.

FIG. 3A and FIG. 3B show how a switches 211 and 214 can be embodied by a relay switch. Switches 211 and 214 are shown within a relay switch 301. A node 307 is coupled to A line 204, a node 309 is coupled to cell 201, a node 313 is coupled to common line 207 and a node 311 is coupled to cell 201.

In FIG. 3A, relay 301 is shown in the "off" position, i.e. switches 211 and 214 are open (non-conducting). When switches 211 and 214 are open, a node 306 is coupled to a node 308 by a connector 304, and a node 312 is coupled to a node 310 by a connector 305. Nodes 306, 308, 310, and 312 may be used in a series protection line (see below). In FIG. 3B, relay 301 is shown in the "on" position, i.e. switches 211 and 214 are closed (conducting). When switches 211 and 214 are closed, node 307 is coupled to node 309 by a connector 364, and node 313 is coupled to node 311 by a connector 365. Thus when relay 301 is "off" cell 201 is not electrically connected to A line 204, and when relay 301 is "on" cell 201 is electrically connected to A line 204 and to common line 207. Similarly, relay switches may be used for switches 212-213, 221-224, and 231-234.

Figure 4:
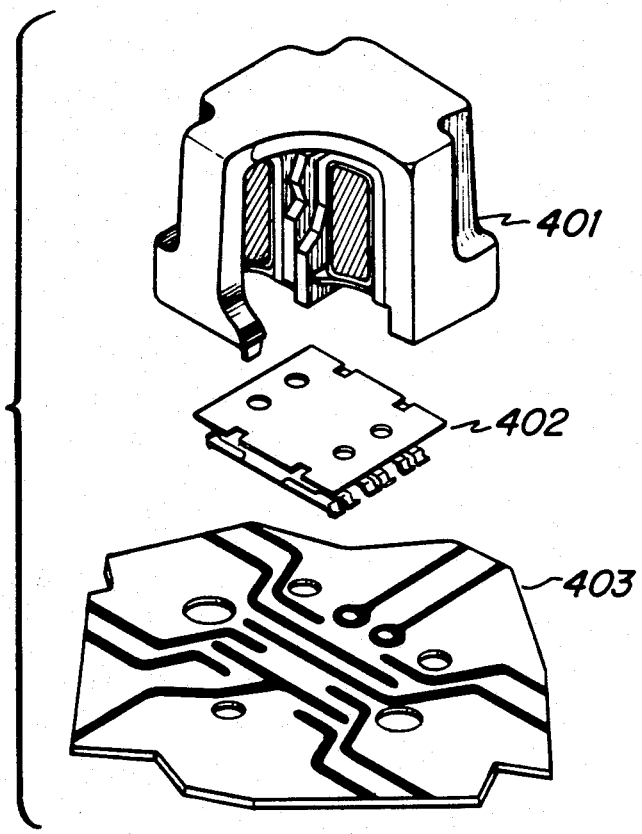
FIG. 4 shows a relay switch in accordance with the preferred embodiment of the present invention.

In FIG. 4 relay 301 is shown to be comprised of an encapsulated motor section 401, a magnetically pivoted swinger assembly 402 and a fixed contact section on a printed circuit board 403.

Figure 5:
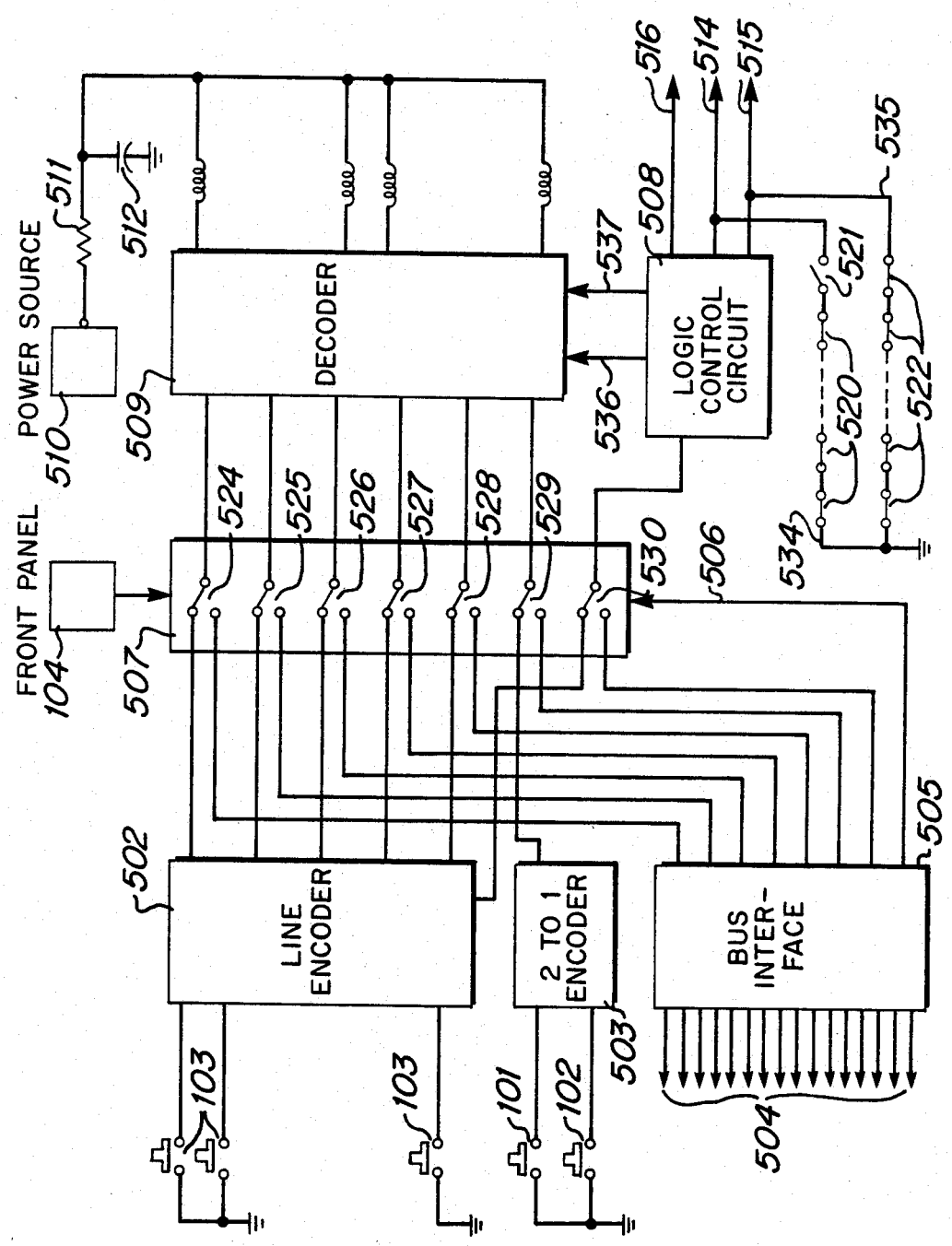
FIG. 5 shows a block diagram of a standard cell intercomparator in accordance with the preferred embodiment of the present invention.

In FIG. 5, pushbuttons 103 are shown coupled to a 32 to 5 line encoder 502. The presence of encoder 502 insures that an operator can select only 1 cell at a time.

Pushbuttons 101 and 102 are shown coupled to a 2 to 1 encoder 503. Outputs from encoders 502 and 503 are coupled through a series of switches 507. Series of switches 507 comprises a series of gates 524-530 which act like single-pole-double-throw switches and which determine whether selection of cells is done by pushbuttons 101-103, or by inputs 504 from a bus interface 505. Series of switches 507 may be, for example, two Quadruple 2-line-to-1-line data selectors such as a part number SN74LS157 manufactured by Texas Instruments of Dallas, Tex. Inputs 504 may be inputs from a computer interface, for example, inputs formulated according to GP-IB interface bus standard IEEE-488. Gates 524-530 within series of switches 507 may be toggled by an input 506 from interface 505 or returned to frontpanel control by switch 105.

Outputs from series of switches 507 are coupled to a 6 to 64 line decoder 509 and to a logic control circuit 508. Decoder 509 includes circuits to drive 32 A line relay coils 513 and 32 B line relay coils 523. Relay coils 513 and 523 are found within relays such as relay 301 shown in FIGS. 3A, 3B and 4. An output from each relay coil in relay coils 513 and 523 is coupled through a resistance 511, typically 200 ohms, to a power source 510 typically set at 13 volts. A capacitance 512, typically 5 microfarads is shown coupled to resistance 511 and to a reference voltage (ground). Capacitance 512 limits the power available to relay coils 513 and 514 so that only one relay may be switched at a time. This protects cells from being misconnected by a malfunction in decoder 509.

Logic control circuit 508 is coupled to a series protection line 534 for A line 204 and to a series protection line 535 for B line 205. Series protection lines 534 and 535 are also coupled to a reference voltage (ground). A plurality of switches 520, a switch 521 and a plurality of switches 522 are switched by a relay. As described in the discussion of FIG. 3A, when a relay is "off", its associated series protection line switch will be closed (conducting) and when a relay is "on", its associated series protection line switch will be open (non-conducting). If any switch on series protection line 534 is open (in this case switch 521 is open) then circuit 508 will signal decoder 509 through an A line close gate 536, so that decoder 509 will not allow any more cells to be coupled to A line 204. Similarly, if any switch on series protection line 535 is open then circuit 508 will signal decoder 509 through a B line close gate 537, so that decoder 509 will not allow any more cells to be coupled to B line 205.

Series protection wires 534 and 535 may be coupled by outputs 514 and 515 respectively to series protection wires in other standard cell intercomparators, thus providing cell protection when a plurality of standard cell intercomparators are used together.

I claim:

1. An apparatus for selecting a first cell and a second cell from a plurality of cells for intercomparing voltage potentials of the first cell and the second cell, each cell within the plurality of cells having a first terminal and a second terminal, wherein the first terminal is of opposite polarity to the second terminal, the apparatus comprising:

a common line;
an A line coupled to the measuring means;
a B line coupled to the measuring means;
a plurality of A switches, each A switch having an "on" position and an "off" position, and each cell in the plurality of cells having associated with that cell an A switch from the plurality of A switches and each A switch being coupled to the A line and to the common line so that a first A switch in the plurality of A switches associated with the first cell electrically couples the first terminal of the first cell to the common line, and the first A switch electrically couples the second terminal of the first cell to the A line, when the first A switch is in the "on" position;
a plurality of B switches, each B switch having an "on" position and an "off" position, and each cell in the plurality of cells having associated with that cell a B switch from the plurality of B switches and each B switch being coupled to the B line and to the common line so that a first B switch in the plurality of B switches associated with the second cell electrically couples the first terminal of the second cell to the common line, and the first B switch electrically couples the second terminal of the second cell to the B line, when the first B switch is in the "on" position;
a power source; and,
relay activation prevention means coupled to the plurality of A switches and to the plurality of B switches for preventing more than one switch from the plurality of A switches and the plurality of B switches from being toggled to the "on" position simultaneously, wherein the relay activation prevention means includes a capacitance means coupled to the plurality of A switches and to the plurality of B switches and to the power source for limiting power to the plurality of A switches and the plurality of B switches.

2. An apparatus as in claim 1 wherein the capacitance means is a capacitor electrically coupled to a reference voltage through a resistance.

3. An apparatus as in claim 1 additionally comprising:
logic control circuit means coupled to the plurality of A switches for detecting when any A switch from the plurality A switches is in the "on" position and for preventing any other A switch from the plurality of A switches to be toggled to the "on" position until the A switch in the "on" position is toggled to the "off" position.

4. An apparatus as in claim 3 additionally comprising:
a reference voltage;
a first control line; and,
a first series protection line coupled to the logic control circuit means, coupled to the plurality of A switches and coupled to the reference voltage so that when every A switch in the plurality of A switches is in the "off" position, the first control line is electrically coupled to the reference voltage and when every A switch in the plurality of A switches is not in the "off" position the first control line is not electrically coupled to the reference voltage.

5. An apparatus as in claim 3 wherein the logic control means is additionally coupled to the plurality of B switches and is additionally for detecting when any B switch from the plurality of B switches is in the "on" position and additionally for preventing any other B switch from the plurality of B switches to be toggled to the "on" position until the B switch in the "on" position is toggled to the "off" position.

6. An apparatus as in claim 3 additionally comprising:
a reference voltage;
a first control line;
a first series protection line coupled to the logic control circuit means, coupled to the plurality of A switches and coupled to the reference voltage so that when every A switch in the plurality of A switches is in the "off" position, the first control line is electrically coupled to the reference voltage and when every A switch in the plurality of A switches is not in the "off" position the first control line is not electrically coupled to the reference voltage;
a second control line; and,
a second series protection line coupled to the logic control circuit means, coupled to the plurality of B switches and coupled to the reference voltage so that when every B switch in the plurality of B switches is in the "off" position, the second control line is electrically coupled to the reference voltage and when every B switch in the plurality of B switches is not in the "off" position the second control line is not electrically coupled to the reference voltage.

7. An apparatus for selecting a first cell and a second cell from a plurality of cells for intercomparing voltage potentials of the first cell and the second cell, each cell within the plurality of cells having a first terminal and a second terminal, wherein the first terminal is of opposite polarity to the second terminal, the apparatus comprising:
a plurality of switches, each switch having an "on" position and an "off" position, the plurality of switches being coupled to the plurality of cells in such a manner that any cell in the plurality of cells may be selected to have its voltage potential intercompared with any other cell in the plurality of cells;
a power source; and,
relay activation prevention means coupled to a first subplurality of at least two switches from the plurality of switches for preventing more than one switch from the first subplurality of switches from being toggled to the "on" position simultaneously, wherein the relay activation prevention means includes a capacitance means coupled to the first subplurality of switches and to the power source for limiting power to the first subplurality of switches.

8. An apparatus as in claim 7 wherein the capacitance means is a capacitor electrically coupled to a reference voltage through a resistance.

9. An apparatus for selecting a first cell and a second cell from a plurality of cells for intercomparing voltage potentials of the first cell and the second cell, each cell within the plurality of cells having a first terminal and a second terminal, wherein the first terminal is of opposite polarity to the second terminal, the apparatus comprising:
a plurality of switches, each switch having an "on" position and an "off" position, the plurality of switches being coupled to the plurality of cells in such a manner that any cell in the plurality of cells may be selected to have its voltage potential intercompared with any other cell in the plurality of cells;

logic control circuit means coupled to a first subplurality of at least two switches from the plurality of switches for detecting when any switch from the first subplurality of switches is in the "on" position and for preventing any other switch from the first subplurality of switches to be toggled to the "on" position until the switch in the "on" position is toggled to the "off" position.

10. An apparatus as in claim 9 additionally comprising:
   a reference voltage;
   a first control line; and,
   a first series protection line coupled to the logic control circuit means, coupled to the first subplurality of switches and coupled to the reference voltage so that when every switch in the first subplurality of switches is in the "off" position, the first control line is electrically coupled to the reference voltage and when every switch in the first subplurality of switches is not in the "off" position the first control line is not electrically coupled to the reference voltage.

11. An apparatus as in claim 9 wherein the logic control means is additionally coupled to a second subplurality if at least two switches from the plurality of switches and is additionally for detecting when any switch from the second subplurality of switches is in the "on" position and additionally for preventing any other switch from the second subplurality of switches to be toggled to the "on" position until the switch in the "on" position is toggled to the "off" position.

12. An apparatus as in claim 11 additionally comprising:
   a reference voltage;
   a first control line;
   a first series protection line coupled to the logic control circuit means, coupled to the first subplurality of switches and coupled to the reference voltage so that when every switch in the first subpluralilty of switches is in the "off" position, the first control line is electrically coupled to the reference voltage and when every switch in the first subplurality of switches is not in the "off" position the first control line is not electrically coupled to the reference voltage;
   a second control line; and,
   a second series protection line coupled to the logic control circuit means, coupled to the second subplurality of switches and coupled to the reference voltage so that when every switch in the second subplurality of switches is in the "off" position, the second control line is electrically coupled to the reference voltage and when every switch in the second subplurality of switches is not in the "off" position the second control line is not electrically coupled to the reference voltage.

* * * * *